United States Patent
Seong et al.

(10) Patent No.: US 11,237,766 B2
(45) Date of Patent: Feb. 1, 2022

(54) STORAGE DEVICE AND METHOD OF OPERATING OF THE STORAGE DEVICE

(71) Applicant: SK hynix Inc., Icheon-si (KR)

(72) Inventors: Jin Yong Seong, Seoul (KR); Kyu Tae Park, Yongin-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 16/864,776

(22) Filed: May 1, 2020

(65) Prior Publication Data
US 2021/0096773 A1 Apr. 1, 2021

(30) Foreign Application Priority Data
Sep. 30, 2019 (KR) ........................ 10-2019-0121014

(51) Int. Cl.
| | |
|---|---|
| *G06F 3/00* | (2006.01) |
| *G06F 3/06* | (2006.01) |
| *G11C 16/30* | (2006.01) |
| *G11C 16/04* | (2006.01) |
| *G11C 16/26* | (2006.01) |
| *G11C 16/10* | (2006.01) |
| *G11C 16/14* | (2006.01) |

(52) U.S. Cl.
CPC .......... *G06F 3/0659* (2013.01); *G06F 3/0604* (2013.01); *G06F 3/0673* (2013.01); *G11C 16/0483* (2013.01); *G11C 16/30* (2013.01); *G11C 16/10* (2013.01); *G11C 16/14* (2013.01); *G11C 16/26* (2013.01)

(58) Field of Classification Search
CPC ......... G11C 16/30; G11C 16/06; G11C 16/34; G11C 16/0483; G11C 16/10; G11C 16/14; G11C 16/26; G11C 5/144; G11C 7/06; G11C 7/22; G11C 11/34; G11C 16/3404; G11C 5/147; G06F 12/0246; G06F 1/3225; G06F 3/0604; G06F 3/0659; G06F 3/0673; H01L 27/108
USPC ...... 365/185.18, 189.05, 189.14, 204, 210.1, 365/210.12; 711/103
See application file for complete search history.

(56) References Cited

U.S. PATENT DOCUMENTS

2018/0129601 A1* 5/2018 Tanaka .................. G06F 1/3225

FOREIGN PATENT DOCUMENTS

KR      1020190100780 A    8/2019

* cited by examiner

*Primary Examiner* — Thong Q Le
(74) *Attorney, Agent, or Firm* — William Park & Associates Ltd.

(57) ABSTRACT

Provided herein may be a storage device and a method of operating the storage device. A memory device may include a memory cell array including a plurality of memory cells, a peripheral circuit configured to perform an operation on memory cells selected from among the plurality of memory cells, a voltage variation detector configured to generate voltage variation information indicating whether a voltage variation has occurred in a supply voltage during performance of the operation, a power register configured to store the voltage variation information, a status register configured to store status information indicating an operating status of the memory device, and a register output controller configured to update the status information provided from the status register based on the voltage variation information.

20 Claims, 14 Drawing Sheets

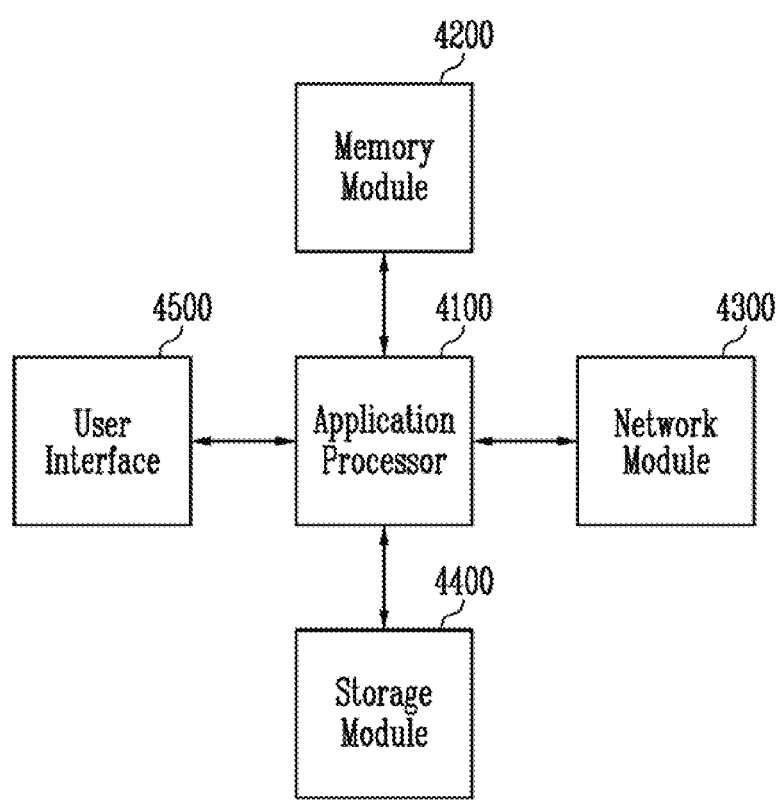

STORAGE DEVICE AND METHOD OF OPERATING OF THE STORAGE DEVICE

CROSS-REFERENCE TO RELATED APPLICATION

The present application claims priority under 35 U.S.C. § 119(a) to Korean patent application number 10-2019-0121014, filed on Sep. 30, 2019, in the Korean Intellectual Property Office, the entire disclosure of which is incorporated herein by reference.

BACKGROUND

1. Technical Field

Various embodiments of the present disclosure generally relate to an electronic device, and more particularly, to a storage device and a method of operating the storage device.

2. Related Art

A storage device is a device which stores data under the control of a host device, such as a computer or a smartphone. The storage device may include a memory device in which data is stored and a memory controller which controls the memory device. Such memory devices are classified into a volatile memory device and a nonvolatile memory device.

The volatile memory device is a memory device in which data is stored only when power is supplied and in which stored data is lost when the supply of power is interrupted. Examples of the volatile memory device include a Static Random Access Memory (SRAM) and a Dynamic Random Access Memory (DRAM).

The nonvolatile memory device is a memory device in which stored data is retained even when the supply of power is interrupted. Examples of the nonvolatile memory device include a Read Only Memory (ROM), a Programmable ROM (PROM), an Electrically Programmable ROM (EPROM), an Electrically Erasable and Programmable ROM (EEPROM), and a flash memory.

SUMMARY

An embodiment of the present disclosure may provide for a memory device. The memory device may include a memory cell array including a plurality of memory cells, a peripheral circuit configured to perform an operation on memory cells selected from among the plurality of memory cells, a voltage variation detector configured to generate voltage variation information indicating whether a voltage variation has occurred in a supply voltage during performance of the operation, a power register configured to store the voltage variation information, a status register configured to store status information indicating an operating status of the memory device, and a register output controller configured to update the status information provided from the status register based on the voltage variation information.

An embodiment of the present disclosure may provide for a method of operating a memory device including a power register and a status register. The method may include initiating an operation to be performed on memory cells selected from among a plurality of memory cells in response to a command received from a memory controller, storing voltage variation information, indicating whether a voltage variation has occurred in a supply voltage during performance of the operation, in the power register, storing status information indicating an operating status of the memory device in the status register, and updating the status information provided from the status register based on the voltage variation information.

An embodiment of the present disclosure may provide for a storage device. The storage device may include a memory device configured to store voltage variation information indicating whether a voltage variation has occurred in a supply voltage during performance of the operation, store status information indicating an operating status of the memory device, and generate updated status information in which the status information is updated based on the voltage variation information, and a memory controller configured to set a voltage threshold range for determining whether the voltage variation has occurred, determine based on the updated status information whether the operation has failed or has been abnormally performed, and control the memory device so that the operation is re-performed based on a result of the determination.

BRIEF DESCRIPTION OF THE DRAWINGS

FIG. 16 is a block diagram illustrating a user system to which a storage device according to an embodiment of the present disclosure is applied.

DETAILED DESCRIPTION

Structural or functional descriptions in the embodiments of the present disclosure introduced in this specification or application are exemplified to describe embodiments according to the concept of the present disclosure. The embodiments according to the concept of the present disclosure may be practiced in various forms, and should not be construed as being limited to the embodiments described in the specification or application.

Hereinafter, the present disclosure will be described based on examples of embodiments of the present disclosure with reference to the accompanying drawings. Below, embodiments of the present disclosure will be described with reference to the attached drawings.

Various embodiments of the present disclosure may be directed to a storage device that detects voltage variation and a method of operating the storage device.

Figure 1:
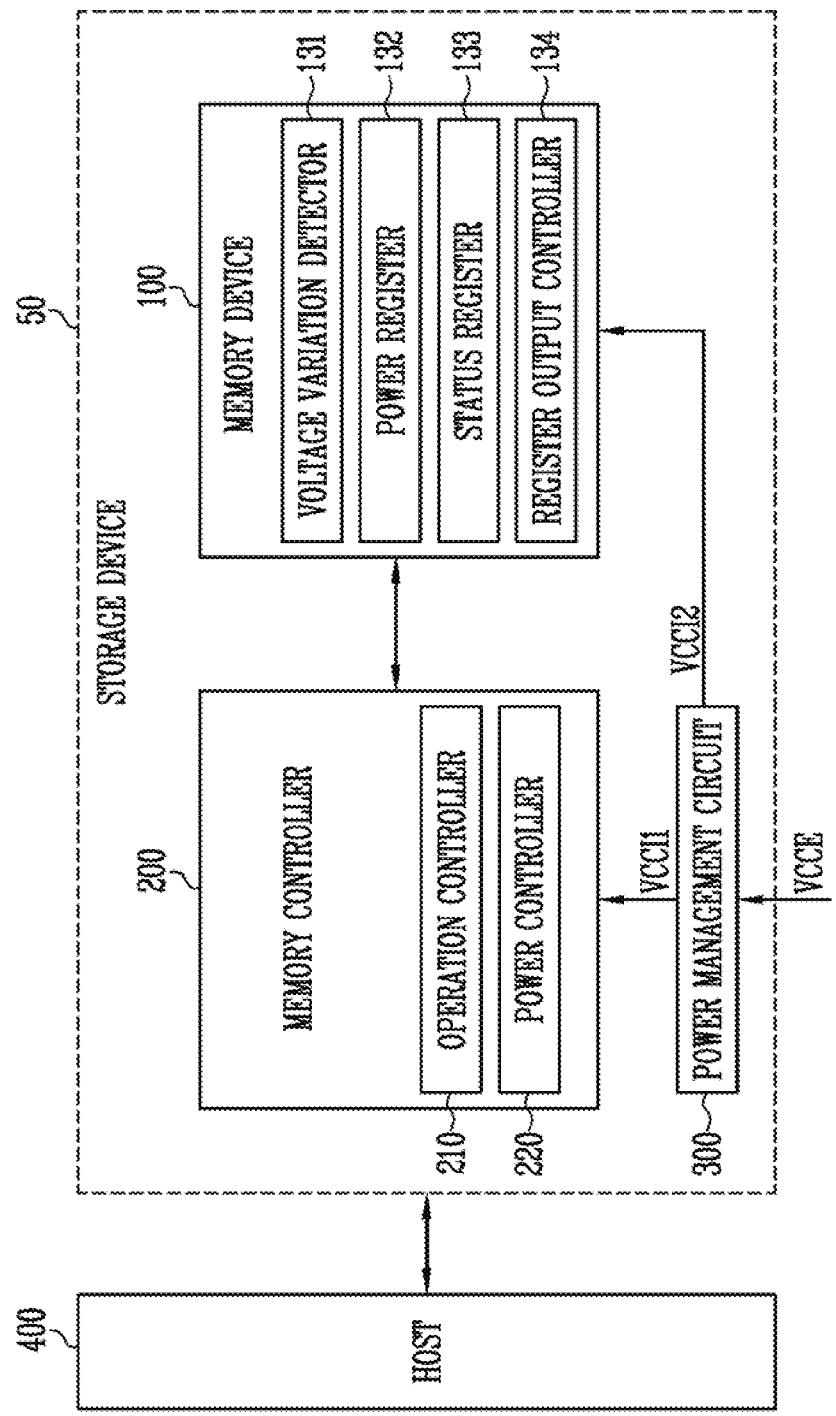
FIG. 1 is a diagram illustrating a storage device according to an embodiment of the present disclosure.

FIG. 1 is a diagram illustrating a storage device according to an embodiment of the present disclosure.

Referring to FIG. 1, a storage device 50 may include a memory device 100, a memory controller 200 which controls the operation of the memory device, and a power management circuit 300 which supplies power to the memory device 100 and the memory controller 200. The storage device 50 may be a device which stores data under the control of a host 400, such as a mobile phone, a smartphone, an MP3 player, a laptop computer, a desktop computer, a game console, a television (TV), a tablet personal computer (PC), or an in-vehicle infotainment system.

The storage device 50 may be manufactured as any one of various types of storage devices depending on a host interface that is a scheme for communication with the host 400. The storage device 50 may be implemented as any one of various types of storage devices, for example, a solid state drive (SSD), a multimedia card such as an MMC, an embedded MMC (eMMC), a reduced size MMC (RS-MMC), or a micro-MMC, a secure digital card such as an SD, a mini-SD, or a micro-SD, a universal storage bus (USB) storage device, a universal flash storage (UFS) device, a personal computer memory card international association (PCMCIA) card-type storage device, a peripheral component interconnection (PCI)-card type storage device, a PCI express (PCI-E) card-type storage device, a compact flash (CF) card, a smart media card, and a memory stick.

The storage device 50 may be manufactured in any one of various types of package forms. For example, the storage device 50 may be manufactured in any one of various types of package forms, such as package on package (POP), system in package (SIP), system on chip (SOC), multi-chip package (MCP), chip on board (COB), wafer-level fabricated package (WFP), and wafer-level stack package (WSP).

The memory device 100 may store data. The memory device 100 is operated in response to the control of the memory controller 200. The memory device 100 may include a memory cell array including a plurality of memory cells which store data.

Each of the memory cells may be implemented as a single-level cell (SLC) capable of storing one data bit, a multi-level cell (MLC) capable of storing two data bits, a triple-level cell (TLC) capable of storing three data bits, or a quad-level cell (QLC) capable of storing four data bits.

The memory cell array may include a plurality of memory blocks. Each memory block may include a plurality of memory cells. One memory block may include a plurality of pages. In an embodiment, each page may be a unit by which data is stored in the memory device 100 or by which data stored in the memory device 100 is read.

A memory block may be a unit by which data is erased. In an embodiment, the memory device 100 may take many alternative forms, such as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive RAM (RRAM), a phase-change memory (PRAM), a magnetoresistive RAM (MRAM), a ferroelectric RAM (FRAM), or a spin transfer torque RAM (STT-RAM). In the present specification, for convenience of description, a description will be made on the assumption that the memory device 100 is a NAND flash memory.

The memory device 100 may receive a command and an address from the memory controller 200, and may access the area of the memory cell array, selected by the address. That is, the memory device 100 may perform an operation indicated by the command on the area selected by the address. For example, the memory device 100 may perform a write operation (i.e., program operation), a read operation, and an erase operation. During a program operation, the memory device 100 may program data to the area selected by the address. During a read operation, the memory device 100 may read data from the area selected by the address. During an erase operation, the memory device 100 may erase data stored in the area selected by the address.

The memory device 100 may be provided with a supply voltage VCCI2 from the power management circuit 300. The memory device 100 may perform various management operations to secure the reliability of the operation of the memory device 100 depending on a change in the level of the supply voltage VCCI2. For example, when the provision of a supply voltage from the power management circuit 300 is suddenly interrupted (hereinafter referred to as "sudden power-off: SPO"), faults, such as damage to data currently being programmed to the memory device 100, may occur. Therefore, when the sudden power-off occurs, the memory device 100 may monitor the level of the supply voltage VCCI2 to safely preserve data.

When the supply voltage VCCI2 decreases below a predetermined level and a sudden power-off is expected to occur, the memory device 100 may perform an operation for discharging voltages that are supplied to word lines WL and bit lines BL coupled to memory cells included in the memory device 100.

The memory device 100 may include a power-on reset (POR) circuit to prevent malfunctioning when the supply voltage VCCI2 is supplied. When the supply voltage VCCI2 is applied to the memory device 100, if the supply voltage VCCI2 reaches a predetermined level, the power-on reset circuit may provide a reset signal for initializing flip-flops, latches, counters, registers, etc. which constitute the memory device 100.

For example, when the supply voltage VCCI2 reaches the predetermined level during a power-on operation, the memory device 100 may output an activated reset signal. Thereafter, when the supply voltage VCCI2 reaches a normal operating voltage, the reset signal is deactivated. In response to the activated reset signal, the internal components of the memory device 100 may be reset to an initial state. The power-on reset circuit may also detect the level of the supply voltage VCCI2.

Depending on power supply conditions of the power management circuit 300 and power consumption of the memory device 100, the supply voltage VCCI2 provided to the memory device 100 may instantaneously and suddenly rise (overshoot) or fall (undershoot).

That is, the memory controller 200 normally operates, and the memory device 100 instantaneously undergoes a voltage drop or a voltage rise, but enables a normal operation. When a program operation, a read operation or an erase operation is performed, the memory device 100 may perform the corresponding operation, but the reliability of the results of performing the operation may be deteriorated.

In an embodiment, the memory device 100 may store voltage variation information indicating whether voltage variation has occurred in the supply voltage while the memory device 100 is performing an operation. The memory device 100 may store status information indicating the operating status of the memory device 100. The memory device 100 may generate updated status information in which the status information is updated based on the voltage variation information. The memory device 100 may provide the updated status information to the memory controller 200.

For this operation, the memory device 100 may include a voltage variation detector 131, a power register 132, a status register 133, and a register output controller 134.

The voltage variation detector 131 may generate voltage variation information indicating whether voltage variation has occurred in the supply voltage VCCI2 input to the memory device 100. The voltage variation detector 131 may store the generated voltage variation information in the power register 132.

The power register 132 may store power management information. The power management information may include sensing mode setting information, threshold voltage information, and the voltage variation information. The sensing mode setting information may indicate whether the voltage variation information is to be incorporated into the status information that is to be output from the register output controller 134 to the memory controller 200. The threshold voltage information may include threshold voltage levels for determining a voltage threshold range.

The status register 133 may store the status information indicating the operating status of the memory device 100. The status information may include ready/busy information and pass/fail information. The ready/busy information may indicate whether a new command can be received and an operation corresponding to a previously received command has been completed. The pass/fail information may indicate whether the operation performed by the memory device 100 has failed.

The register output controller 134 may receive the status information from the status register 133. The register output controller 134 may be configured to, when a status read command is received from the memory controller 200, provide a status read response including the status information to the memory controller 200.

The register output controller 134 may receive the sensing mode setting information and the voltage variation information from the power register 132.

The register output controller 134 may determine whether the status information provided from the status register 133 is to be updated based on the voltage variation information depending on the sensing mode setting information. The sensing mode setting information may indicate any one of an ON state and an OFF state.

For example, when the sensing mode setting information indicates an ON state, the register output controller 134 may update the status information provided from the status register 133 based on the voltage variation information. In this case, the register output controller 134 may provide a status read response including the updated status information to the memory controller 200 in response to the status read command received from the memory controller 200.

When the sensing mode setting information indicates an OFF state, the register output controller 134 might not update the status information provided from the status register 133 based on the voltage variation information. In this case, the register output controller 134 may provide a status read response including non-updated status information to the memory controller 200 in response to the status read command received from the memory controller 200.

The memory controller 200 controls the overall operation of the storage device 50.

When power is applied to the storage device 50, the memory controller 200 may run firmware (FW). When the memory device 100 is a flash memory device, the memory controller 200 may run firmware such as a flash translation layer (FTL) for controlling communication between the host 400 and the memory device 100.

In an embodiment, the memory controller 200 may receive data and a logical block address (LBA) from the host 400, and may translate the logical block address into a physical block address (PBA) indicating the address of memory cells which are included in the memory device 100 and in which data is to be stored.

The memory controller 200 may control the memory device 100 so that a program operation, a read operation or an erase operation is performed in response to a request received from the host 400. During a program operation, the memory controller 200 may provide a write command, a physical block address, and data to the memory device 100. During a read operation, the memory controller 200 may provide a read command and a physical block address to the memory device 100. During an erase operation, the memory controller 200 may provide an erase command and a physical block address to the memory device 100.

In an embodiment, the memory controller 200 may autonomously generate a command, an address, and data regardless of a request from the host 400, and may transmit them to the memory device 100. For example, the memory controller 200 may provide commands, addresses, and data to the memory device 100 to perform background operations, such as a program operation for wear leveling and a program operation for garbage collection.

In an embodiment, the memory controller 200 may control at least two memory devices 100. In this case, the memory controller 200 may control the memory devices 100 depending on an interleaving scheme to improve operating performance. The interleaving scheme may be an operating manner in which the operating periods of the at least two memory devices 100 are caused to overlap each other.

The memory controller 200 may be operated using a supply voltage VCCI1 supplied from the power management circuit 300.

In an embodiment, the memory controller 200 may include an operation controller 210 and a power controller 220.

The operation controller 210 may provide a status read command to each memory device 100. The operation controller 210 may receive a status read response corresponding to the status read command from the memory device 100. The operation controller 210 may determine, based on status information included in the status read response, whether the operation of the memory device 100 has failed. The operation controller 210 may determine, based on the status information, whether the operation of the memory device 100 has been abnormally performed.

The operation controller 210 may control the memory device 100 so that, when the operation of the memory device 100 has failed or has been abnormally performed, the memory device 100 re-performs the corresponding operation. In an embodiment, re-performing a corresponding operation may mean performing the operation for a second time.

For example, the operation controller 210 may control the memory device 100 so that, when the operation is a program operation and has failed, the program operation is re-performed on a memory area other than a memory area on which the program operation has been performed. The operation controller 210 may control the memory device 100 so that, when the operation is an erase operation and has failed, the erase operation is re-performed on the memory area on which the erase operation has been performed. The operation controller 210 may control the memory device 100 so that, when the operation is a read operation and has been abnormally performed, the read operation is re-performed on the memory area on which the read operation has been performed.

The memory device 100 may re-perform the read operation without performing error correction decoding on read data acquired through the abnormally performed read operation, thus reducing unnecessary error correction decoding.

The power controller 220 may provide a set power command for managing the power status of the memory device 100 to the memory device 100.

For example, the power controller 220 may establish the sensing mode setting information and threshold voltage information stored in the memory device 100 based on the set power command. The set power command may include at least one of a set feature command (Set Feature) and a set parameter command (Set Para).

The power management circuit 300 may receive external power and then generate internal power. The power management circuit 300 may generate various supply voltages VCCI1 and VCCI2 using an external voltage VCCE. The power management circuit 300 may provide the supply voltage VCCI1 to the memory controller 200, and may provide the supply voltage VCC2 to the memory device 100.

The host 400 may communicate with the storage device 50 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
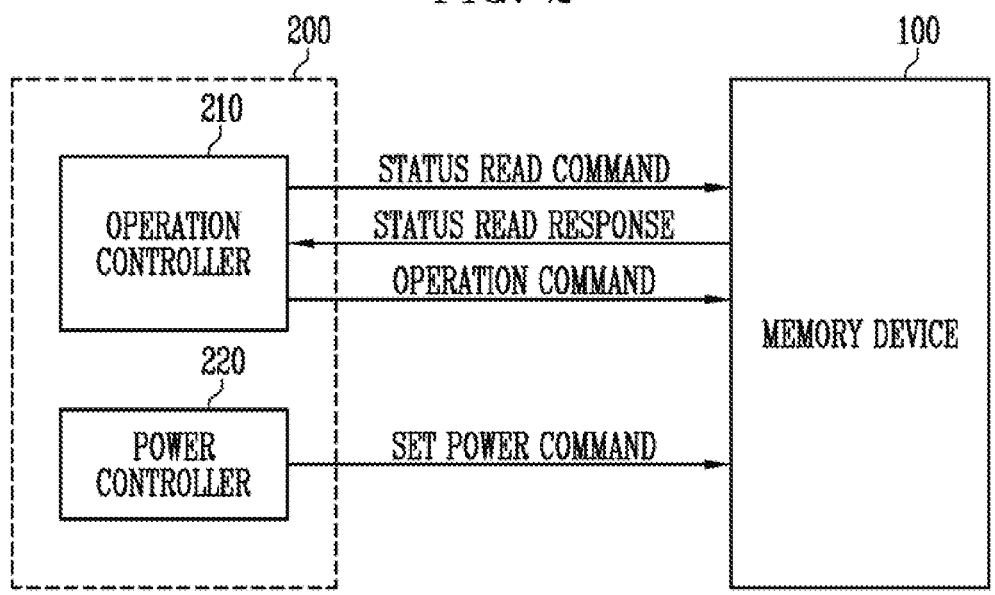
FIG. 2 is a diagram illustrating the configuration and operation of a memory controller of FIG. 1.

FIG. 2 is a diagram illustrating the configuration and operation of the memory controller of FIG. 1.

Referring to FIG. 2, the memory controller 200 may include an operation controller 210 and a power controller 220.

The operation controller 210 may provide a status read command to the memory device 100. The operation controller 210 may receive a status read response corresponding to the status read command from the memory device 100. The operation controller 210 may determine, based on the status information included in the status read response, whether the operation of the memory device 100 has failed.

The operation controller 210 may provide an operation command to the memory device 100 so that, when the operation of the memory device 100 has failed, the memory device 100 re-performs the corresponding operation. The operation command may be any one of an erase command, a program command, and a read command.

For example, when the operation is a program operation and has failed, the operation controller 210 may provide the memory device 100 with a program command for a memory area other than a memory area on which the program operation has been performed. When the operation is an erase operation and has failed, the operation controller 210 may provide the memory device 100 with an erase command for the memory area on which the erase operation has been performed.

The power controller 220 may provide the memory device 100 with a set power command for managing the power status of the memory device 100.

The power controller 220 may establish the sensing mode setting information stored in the memory device 100 based on the set power command. The set power command may include at least one of a set feature command (Set Feature) and a set parameter command (Set Para).

The sensing mode setting information may indicate whether the memory device 100 is to incorporate voltage variation information into the status information included in the status read response. The voltage variation information may be information indicating whether voltage variation has occurred in the supply voltage of the memory device 100 while the memory device 100 is performing the corresponding operation.

For example, when the sensing mode setting information indicates an ON state, the memory device 100 may provide a status read response, including status information updated based on the voltage variation information, to the memory controller 200. For example, when the sensing mode setting information indicates an OFF state, the memory device 100 may provide a status read response, including status information which is not updated based on the voltage variation information, to the memory controller 200.

The power controller 220 may establish threshold voltage information stored in the memory device 100 based on the set power command. The threshold voltage information may include threshold voltage levels for determining a voltage threshold range. The voltage threshold range may be the range of the supply voltage, which is set to determine whether voltage variation has occurred.

Figure 3:
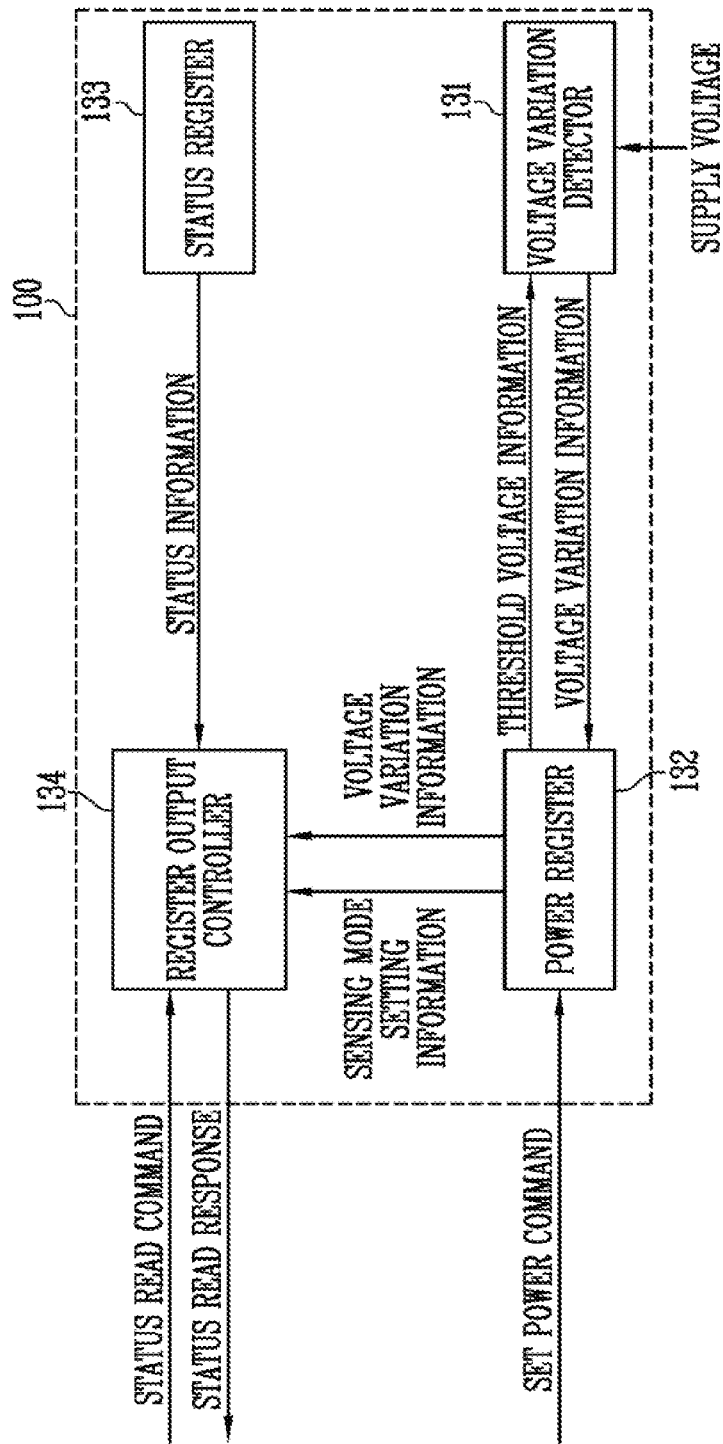
FIG. 3 is a diagram illustrating the configuration and operation of a memory device of FIG. 2.

FIG. 3 is a diagram illustrating the configuration and operation of the memory device of FIG. 2.

Referring to FIG. 3, the memory device 100 may include a voltage variation detector 131, a power register 132, a status register 133, and a register output controller 134.

The voltage variation detector 131 may detect whether voltage variation has occurred in a supply voltage input to the memory device 100.

For example, the voltage variation detector 131 may determine a voltage threshold range based on threshold voltage levels included in threshold voltage information. The voltage threshold range may be the range of the supply voltage, which is set to determine whether voltage variation has occurred.

For example, the voltage threshold range may be a range between a first threshold voltage level and a second threshold voltage level. The first threshold voltage level may be higher than the second threshold voltage level.

The voltage variation detector 131 may determine whether voltage variation has occurred depending on whether the supply voltage exceeds the voltage threshold range. The voltage variation detector 131 may generate voltage variation information, indicating whether voltage variation has occurred, based on the result of the determination.

The voltage variation information may include voltage rise information and voltage drop information. The voltage rise information may be information indicating whether the supply voltage exceeds the voltage threshold range and then a voltage rise has occurred. The voltage drop information may be information indicating whether the supply voltage exceeds the voltage threshold range and then a voltage drop has occurred.

For example, the voltage variation detector 131 may generate voltage rise information when the supply voltage is higher than the first threshold voltage level. The voltage variation detector 131 may generate voltage drop information when the supply voltage is lower than the second threshold voltage level.

The voltage variation detector 131 may provide the generated voltage variation information to the power register 132.

The power register 132 may store power management information.

The power management information may include the sensing mode setting information, the threshold voltage information, and the voltage variation information. The sensing mode setting information may indicate whether the voltage variation information is to be incorporated into the status information that is to be output from the register output controller 134 to the memory controller. The threshold voltage information may include threshold voltage levels for determining a voltage threshold range.

The power register 132 may receive a set power command from the memory controller. The sensing mode setting information and the threshold voltage information stored in the power register 132 may be established in response to the set power command.

The power register 132 may provide the sensing mode setting information and the voltage variation information to the register output controller 134. The power register 132 may provide the threshold voltage information to the voltage variation detector 131.

The status register 133 may store status information indicating the operating status of the memory device 100. The status information may include ready/busy information, pass/fail information, and normal operation information. The ready/busy information may indicate whether a new command can be received and an operation corresponding to a previously received command has been completed. The pass/fail information may indicate whether the operation performed by the memory device 100 has failed. The normal operation information may indicate whether the operation of the memory device 100 has been normally performed.

The status register 133 may provide the status information to the register output controller 134.

The register output controller 134 may receive the status information from the status register 133. The register output controller 134 may be configured to, when a status read command is received from the memory controller, provide a status read response including the status information to the memory controller.

The register output controller 134 may receive the sensing mode setting information and the voltage variation information from the power register 132.

The register output controller 134 may determine whether the status information provided from the status register 133 is to be updated based on the voltage variation information depending on the sensing mode setting information. The sensing mode setting information may indicate any one of an ON state and an OFF state.

For example, when the sensing mode setting information indicates an ON state, the register output controller 134 may update the status information provided from the status register 133 based on the voltage variation information. The register output controller 134 may provide a status read response including the updated status information to the memory controller in response to the status read command received from the memory controller.

In an embodiment, the register output controller 134 may update the pass/fail information included in the status information based on the voltage variation information. The register output controller 134 may determine, based on the voltage variation information, whether voltage variation has occurred. The register output controller 134 may set the pass/fail information so that, when it is determined that voltage variation has occurred, the pass/fail information indicates 'fail'.

In an embodiment, the register output controller 134 may update the normal operation information included in the status information based on the voltage variation information. The register output controller 134 may determine, based on the voltage variation information, whether voltage variation has occurred. The register output controller 134 may set the normal operation information so that, when it is determined that voltage variation has occurred, the normal operation information indicates 'abnormal performance'.

When the sensing mode setting information indicates an OFF state, the register output controller 134 might not update the status information provided from the status register 133 based on the voltage variation information. The register output controller 134 may provide a status read response, including non-updated status information, to the memory controller in response to the status read command received from the memory controller.

Figure 4:
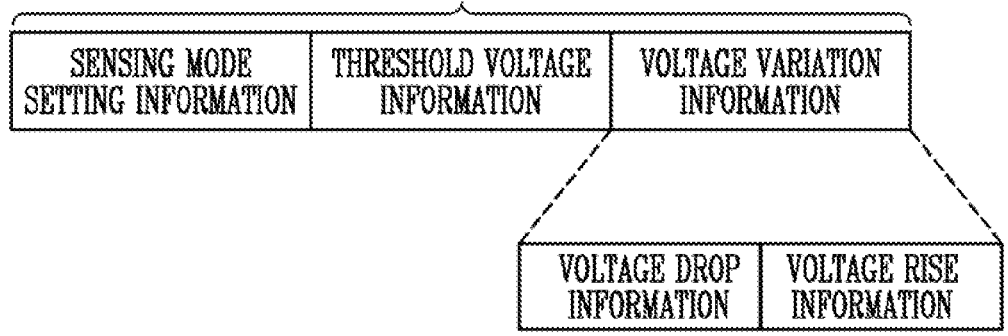
FIG. 4 is a diagram for explaining power management information for managing the power status of a memory device.

FIG. 4 is a diagram for explaining power management information for managing the power status of a memory device.

Referring to FIG. 4, the power register 132 of FIG. 3 may store power management information.

The power management information may include sensing mode setting information, threshold voltage information, and voltage variation information.

The sensing mode setting information may indicate whether voltage variation information is to be incorporated into status information to be output to the memory controller.

The threshold voltage information may include threshold voltage levels for determining a voltage threshold range. The voltage threshold range may be the range of the supply voltage, which is set to determine whether voltage variation has occurred.

The voltage variation information may include voltage rise information and voltage drop information. The voltage rise information may be information indicating whether the supply voltage exceeds the voltage threshold range and then a voltage rise has occurred while the memory device is performing the corresponding operation. The voltage drop information may be information indicating whether the supply voltage exceeds the voltage threshold range and then a voltage drop has occurred while the memory device is performing the corresponding operation.

Figure 5:
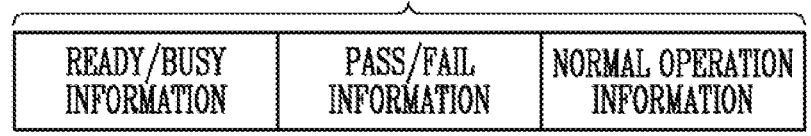
FIG. 5 is a diagram for explaining status information indicating the operating status of a memory device.

FIG. 5 is a diagram for explaining status information indicating the operating status of a memory device.

Referring to FIG. 5, the power register 133 of FIG. 3 may store status information.

The status register 133 may store status information indicating the operating status of the memory device 100. The status information may include ready/busy information, pass/fail information, and normal operation information.

The ready/busy information may indicate whether a new command can be received and an operation corresponding to a previously received command has been completed. The pass/fail information may indicate whether the operation performed by the memory device 100 has failed. The normal operation information may indicate whether the operation of the memory device 100 has been normally performed.

In an embodiment, the pass/fail information may indicate whether a program operation has passed or failed. The pass/fail information may indicate whether an erase operation has passed or failed. The pass/fail information may indicate 'Don't Care' information in relation to whether a read operation has passed or failed. In other words, whether the read operation performed by the memory device has passed or failed might not be determined based on the pass/fail information included in the status information.

In an embodiment, the pass/fail information may indicate whether the read operation has passed or failed. In this case, whether the read operation performed by the memory device has passed or failed may be determined based on the pass/fail information included in the status information.

In an embodiment, the normal operation information may indicate whether the operation performed by the memory device corresponds to 'normal performance' or 'abnormal performance'. The memory device may set the normal operation information so that the normal operation information indicates 'normal performance' as a default value. The memory device may set the normal operation information so that, when it is determined that voltage variation has occurred based on the voltage variation information, the normal operation information indicates 'abnormal performance'.

The type of operation described in the pass/fail information and the normal operation information with reference to FIG. 5 is not limited to the present embodiments.

Figure 6:
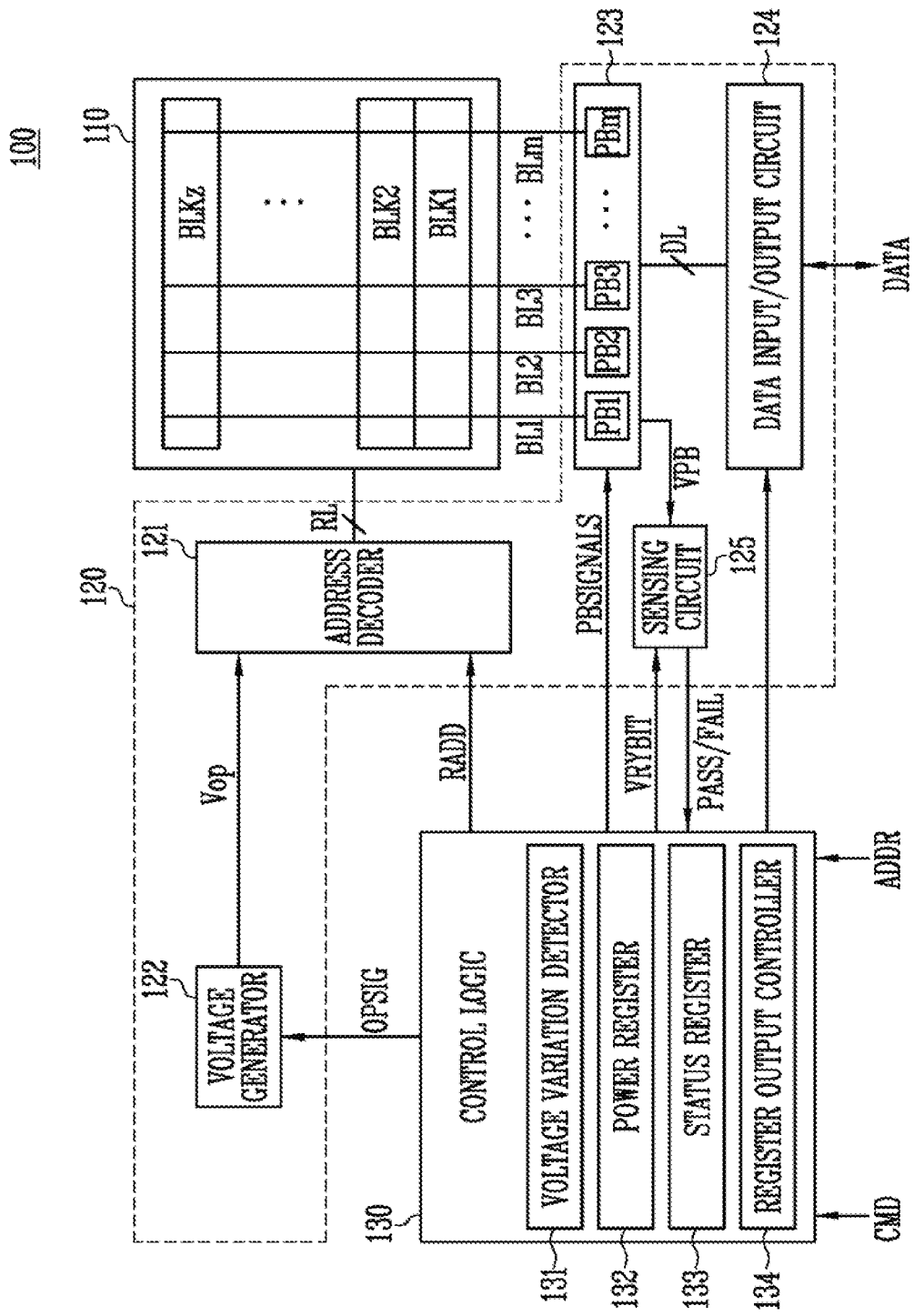
FIG. 6 is a diagram illustrating the structure of the memory device of FIG. 3.

FIG. 6 is a diagram illustrating the structure of the memory device of FIG. 3.

Referring to FIG. 6, the memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 includes a plurality of memory blocks BLK1 to BLKz. The plurality of memory blocks BLK1 to BLKz are coupled to an address decoder 121 through row lines RL. The memory blocks BLK1 to BLKz are coupled to a read and write circuit 123 through bit lines BL1 to BLm. Each of the memory blocks BLK1 to BLKz may include a plurality of memory cells. In an embodiment, the plurality of memory cells may be nonvolatile memory cells. Memory cells coupled to the same word line, among the plurality of memory cells, are defined as one physical page. In other words, the memory cell array 110 may include a plurality of physical pages. In an embodiment of the present disclosure, each of the memory blocks BLK1 to BLKz included in the memory cell array 110 may include a plurality of dummy cells. For the dummy cells, one or more dummy cells may be coupled in series between a drain select transistor and memory cells and between a source select transistor and memory cells.

Each of the memory cells of the memory device 100 may be implemented as a single-level cell (SLC) capable of storing one data bit, a multi-level cell (MLC) capable of storing two data bits, a triple-level cell (TLC) capable of storing three data bits, or a quad-level cell (QLC) capable of storing four data bits.

The peripheral circuit 120 may include the address decoder 121, a voltage generator 122, the read and write circuit 123, a data input/output circuit 124, and a sensing circuit 125.

The peripheral circuit 120 may drive the memory cell array 110. For example, the peripheral circuit 120 may drive the memory cell array 110 so as to perform a program operation, a read operation, and an erase operation.

The address decoder 121 is coupled to the memory cell array 110 through the row lines RL. The row lines RL may include drain select lines, word lines, source selection lines, and a common source line. In accordance with an embodiment of the present disclosure, the word lines may include normal word lines and dummy word lines. In accordance with an embodiment of the present disclosure, the row lines RL may further include a pipe select line.

In an embodiment, the row lines RL may be local lines included in local line groups. Each of the local line groups may correspond to one memory block. The local line group may include a drain select line, local word lines, and a source select line.

The address decoder 121 may be operated under the control of the control logic 130. The address decoder 121 receives addresses ADDR from the control logic 130.

The address decoder 121 may decode a block address, among the received addresses ADDR. The address decoder 121 selects at least one of the memory blocks BLK1 to BLKz according to the decoded block address. The address decoder 121 may decode a row address RADD, among the received addresses ADDR. The address decoder 121 may select at least one word line WL of the selected memory block by applying voltages supplied from the voltage generator 122 to the at least one word line WL according to the decoded row address RADD.

During a program operation, the address decoder 121 may apply a program voltage to the selected word line and apply a pass voltage having a level lower than that of the program voltage to unselected word lines. During a program verify operation, the address decoder 121 may apply a verify voltage to the selected word line and apply a verify pass voltage having a level higher than that of the verify voltage to the unselected word lines.

During a read operation, the address decoder 121 may apply a read voltage to the selected word line and apply a read pass voltage having a level higher than that of the read voltage to the unselected word lines.

In accordance with an embodiment of the present disclosure, an erase operation of the memory device 100 is performed on a memory block basis. During an erase operation, the addresses ADDR input to the memory device 100 include a block address. The address decoder 121 may decode the block address and select one memory block according to the decoded block address. During the erase operation, the address decoder 121 may apply a ground voltage to word lines coupled to the selected memory block.

In accordance with an embodiment of the present disclosure, the address decoder 121 may decode a column address, among the received addresses ADDR. The decoded column address may be transferred to the read and write circuit 123. In an embodiment, the address decoder 121 may include components, such as a row decoder, a column decoder, and an address buffer.

The voltage generator 122 may generate a plurality of operating voltages Vop using an external supply voltage that is supplied to the memory device 100. The voltage generator 122 may be operated under the control of the control logic 130.

In an embodiment, the voltage generator 122 may generate an internal supply voltage by regulating the external supply voltage. The internal supply voltage generated by the voltage generator 122 is used as an operating voltage for the memory device 100.

In an embodiment, the voltage generator 122 may generate the plurality of operating voltages Vop using the external supply voltage or the internal supply voltage. The voltage generator 122 may generate various voltages required by the memory device 100. For example, the voltage generator 122 may generate a plurality of erase voltages, a plurality of program voltages, a plurality of pass voltages, a plurality of select read voltages, and a plurality of unselect read voltages.

The voltage generator 122 may include a plurality of pumping capacitors for receiving the internal supply voltage to generate a plurality of operating voltages Vop having various voltage levels, and may generate the plurality of operating voltages Vop by selectively enabling the plurality of pumping capacitors under the control of the control logic 130.

The generated operating voltages Vop may be supplied to the memory cell array 110 by the address decoder 121.

The read and write circuit 123 includes first to m-th page buffers PB1 to PBm. The first to m-th page buffers PB1 to PBm are coupled to the memory cell array 110 through the first to m-th bit lines BL1 to BLm, respectively. The first to m-th page buffers PB1 to PBm are operated under the control of the control logic 130.

The first to m-th page buffers PB1 to PBm perform data communication with the data input/output circuit 124. During a program operation, the first to m-th page buffers PB1 to PBm receive data DATA to be stored through the data input/output circuit 124 and data lines DL.

During a program operation, the first to m-th page buffers PB1 to PBm may transfer the data DATA to be stored, received through the data input/output circuit 124, to selected memory cells through the bit lines BL1 to BLm when a program voltage is applied to a selected word line. Memory cells in a selected page are programmed based on the received data DATA. Memory cells coupled to a bit line to which a program permission voltage (e.g., a ground voltage) is applied may have increased threshold voltages. The threshold voltages of memory cells coupled to a bit line to which a program inhibit voltage (e.g., a supply voltage) is applied may be maintained. During a program verify operation, the first to m-th page buffers PB1 to PBm read the data DATA stored in the selected memory cells from the selected memory cells through the bit lines BL1 to BLm.

During a read operation, the read and write circuit 123 may read data DATA from the memory cells in the selected page through the bit lines BL, and may store the read data DATA in the first to m-th page buffers PB1 to PBm.

During an erase operation, the read and write circuit 123 may allow the bit lines BL to float. In an embodiment, the read and write circuit 123 may include a column select circuit.

The data input/output circuit 124 is coupled to the first to m-th page buffers PB1 to PBm through the data lines DL. The data input/output circuit 124 is operated in response to the control of the control logic 130.

The data input/output circuit 124 may include a plurality of input/output buffers (not illustrated) which receive input data DATA. During a program operation, the data input/output circuit 124 receives the data DATA to be stored from an external controller (not illustrated). During a read operation, the data input/output circuit 124 outputs the data DATA, received from the first to m-th page buffers PB1 to PBm included in the read and write circuit 123, to the external controller.

During a read operation or a verify operation, the sensing circuit 125 may generate a reference current in response to an enable bit signal VRYBIT generated by the control logic 130, and may output a pass signal or a fail signal to the control logic 130 by comparing a sensing voltage VPB received from the read and write circuit 123 with a reference voltage generated by the reference current.

The control logic 130 may be coupled to the address decoder 121, the voltage generator 122, the read and write circuit 123, the data input/output circuit 124, and the sensing circuit 125. The control logic 130 may control the overall operation of the memory device 100. The control logic 130 may be operated in response to a command CMD transmitted from an external device.

The control logic 130 may control the peripheral circuit 120 by generating various types of signals in response to the command CMD and the addresses ADDR. For example, the control logic 130 may generate an operation signal OPSIG, a row address RADD, read and write circuit control signals PBSIGNALS, and the enable bit VRYBIT in response to the command CMD and the addresses ADDR. The control logic 130 may output the operation signal OPSIG to the voltage generator 122, output the row address RADD to the address decoder 121, output the page buffer control signal PBSIGNALS to the read and write circuit 123, and output the enable bit VRYBIT to the sensing circuit 125. In addition, the control logic 130 may determine whether a verify operation has passed or failed in response to the pass or fail signal PASS or FAIL output from the sensing circuit 125.

In an embodiment, the control logic 130 may include a voltage variation detector 131, a power register 132, a status register 133, and a register output controller 134, which are described above with reference to FIG. 3.

Figure 7:
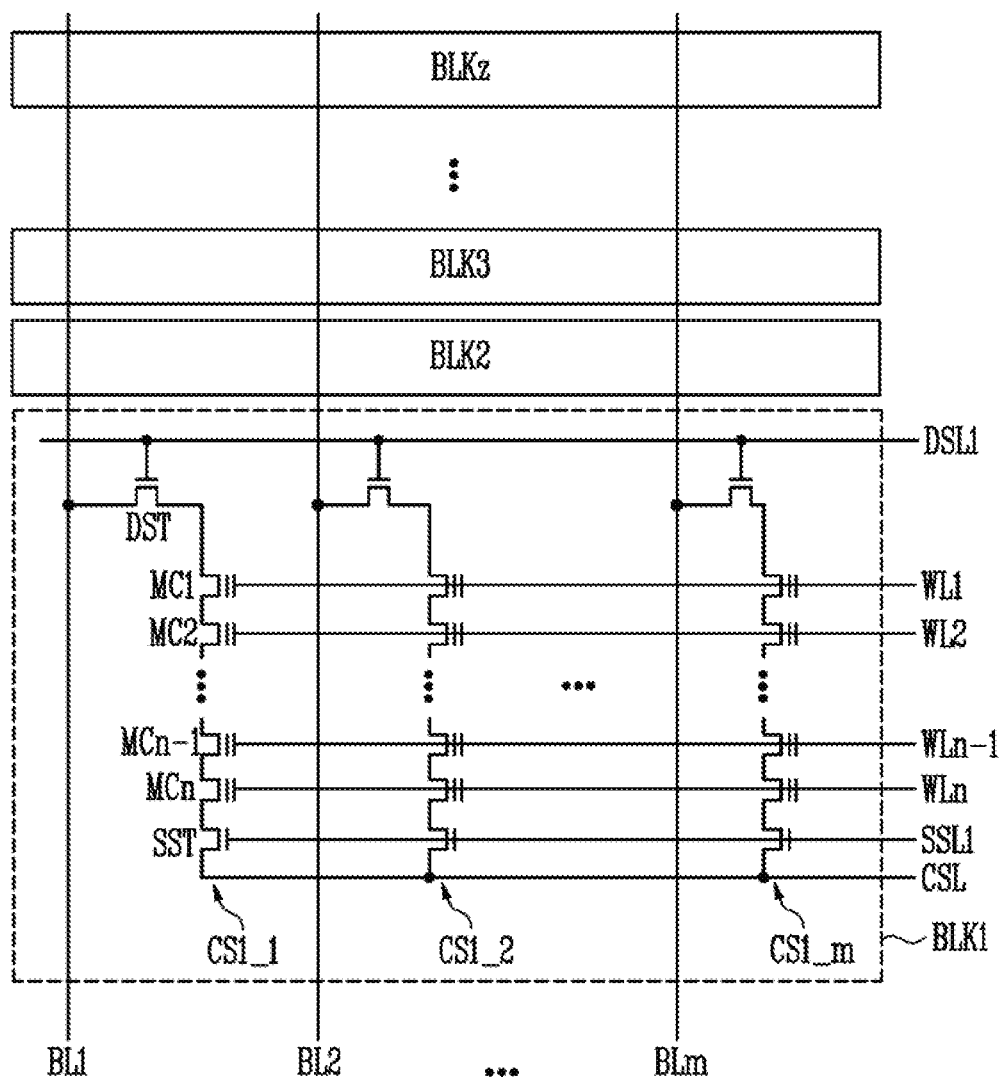
FIG. 7 is a diagram illustrating a memory cell array of FIG. 6.

FIG. 7 is a diagram illustrating the memory cell array of FIG. 6.

Referring to FIG. 7, the first to z-th memory blocks BLK1 to BLKz are coupled in common to the first to m-th bit lines BL1 to BLm. In FIG. 7, for convenience of description, elements included in the first memory block BLK1, among the plurality of memory blocks BLK1 to BLKz, are illustrated, and illustration of elements included in each of the remaining memory blocks BLK2 to BLKz is omitted. It will be understood that each of the remaining memory blocks BLK2 to BLKz has the same configuration as the first memory block BLK1.

The memory block BLK1 may include a plurality of cell strings CS1_1 to CS1_$m$ (where m is a positive integer). The first to m-th cell strings CS1_1 to CS1_$m$ are respectively coupled to the first to m-th bit lines BL1 to BLm. Each of the first to m-th cell strings CS1_1 to CS1_$m$ may include a drain select transistor DST, a plurality of memory cells MC1 to MCn (where n is a positive integer) which are coupled in series to each other, and a source select transistor SST.

A gate terminal of the drain select transistor DST included in each of the first to m-th cell strings CS1_1 to CS1_m is coupled to a drain select line DSL1. Gate terminals of the first to n-th memory cells MC1 to MCn included in each of the first to m-th cell strings CS1_1 to CS1_m are coupled to first to n-th word lines WL1 to WLn, respectively. A gate terminal of the source select transistor SST included in each of the first to m-th cell strings CS1_1 to CS1_m is coupled to a source select line SSL1.

For convenience of description, the structure of each cell string will be described based on the first cell string CS1_1, among the plurality of cell strings CS1_1 to CS1_m. However, it will be understood that each of the remaining cell strings CS1_2 to CS1_m is configured in the same manner as the first cell string CS1_1.

A drain terminal of the drain select transistor DST included in the first cell string CS1_1 is coupled to the first bit line BL1. A source terminal of the drain select transistor DST included in the first cell string CS1_1 is coupled to a drain terminal of the first memory cell MC1 included in the first cell string CS1_1. The first to n-th memory cells MC1 to MCn may be coupled in series to each other. A drain terminal of the source select transistor SST included in the first cell string CS1_1 is coupled to a source terminal of the n-th memory cell MCn included in the first cell string CS1_1. A source terminal of the source select transistor SST included in the first cell string CS1_1 is coupled to a common source line CSL. In an embodiment, the common source line CSL may be coupled in common to the first to z-th memory blocks BLK1 to BLKz.

The drain select line DSL1, the first to n-th word lines WL1 to WLn, and the source select line SSL1 are included in the row lines RL of FIG. 6. The drain select line DSL1, the first to n-th word lines WL1 to WLn, and the source select line SSL1 are controlled by the address decoder 121. The common source line CSL is controlled by the control logic 130. The first to m-th bit lines BL1 to BLm are controlled by the read and write circuit 123.

Figure 8:
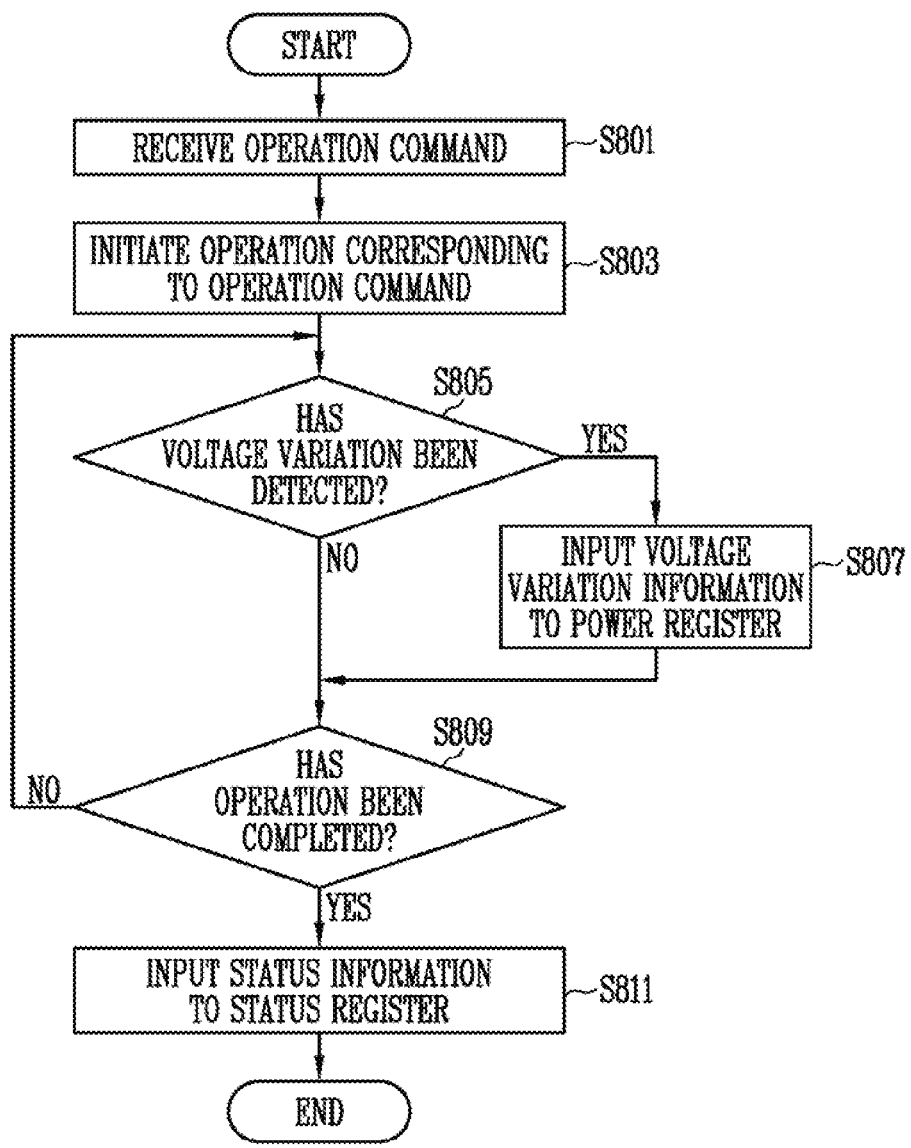
FIG. 8 is a flowchart illustrating the operation of a memory device according to an embodiment.

FIG. 8 is a flowchart illustrating the operation of a memory device according to an embodiment.

Referring to FIG. 8, at step S801, the memory device may receive an operation command from the memory controller. The operation command may be any one of a program command, an erase command, and a read command.

At step S803, the memory device may initiate an operation corresponding to the received operation command. For example, when the operation command is the program command, the memory device may perform a program operation of storing data, received together with the operation command, in a memory area corresponding to an address received together with the operation command. Alternatively, when the operation command is the erase command, the memory device may perform an erase operation on a memory block corresponding to a block address, received together with the erase command. Alternatively, when the operation command is the read command, the memory device may perform a read operation on a memory area corresponding to a block address, received together with the read command.

At step S805, the memory device may determine whether voltage variation has been detected. The voltage variation may refer to a voltage rise attributable to the overshoot of a supply voltage level or a voltage drop attributable to the undershoot of the supply voltage level.

For example, the memory device may monitor the level of the supply voltage. The memory device may determine whether voltage variation has occurred depending on whether the level of the supply voltage exceeds a voltage threshold range. The memory device may detect that a voltage rise has occurred when the level of the supply voltage is higher than a level within the voltage threshold range. The memory device may detect that a voltage drop has occurred when the level of the supply voltage is lower than a level within the voltage threshold range.

When voltage variation is detected, the process proceeds to step S807, whereas when voltage variation is not detected, the process proceeds to step S809.

At step S807, the memory device may store voltage variation information in a power register. The voltage variation information may include at least one of voltage rise information and voltage drop information.

At step S809, the memory device may determine whether the performance of the operation has been completed. As a result of the determination, when the operation is currently being performed, the process may return to step S805, whereas when the operation has been completed, the process proceeds to step S811. That is, the memory device may monitor whether voltage variation has been detected at step S805 until the performance of the corresponding operation is completed. In an embodiment, the memory device may continuously monitor whether voltage variation has been detected at step S805 until the performance of the corresponding operation is completed.

At step S811, the memory device may update the status information stored in the status register. The status information may include ready/busy information, pass/fail information, and normal operation information.

For example, the ready/busy information may indicate whether a new command can be received and an operation corresponding to a previously received command has been completed. The pass/fail information may indicate whether an operation corresponding to the most recently executed command has failed. The normal operation information may indicate whether the operation corresponding to the command has been normally performed.

In an embodiment, the pass/fail information may indicate whether a program operation or an erase operation has failed. The normal operation information may indicate whether a read operation has been normally performed. The type of operation described in the pass/fail information and the normal operation information is not limited to the present embodiments.

In various embodiments, the memory device may provide a status read response including the status information to the memory controller in response to a status read command received from the memory controller. The memory device may update the pass/fail information and the normal operation information included in the status information based on the voltage variation information, and may provide the updated information to the memory controller in response to the status read command.

Figure 9:
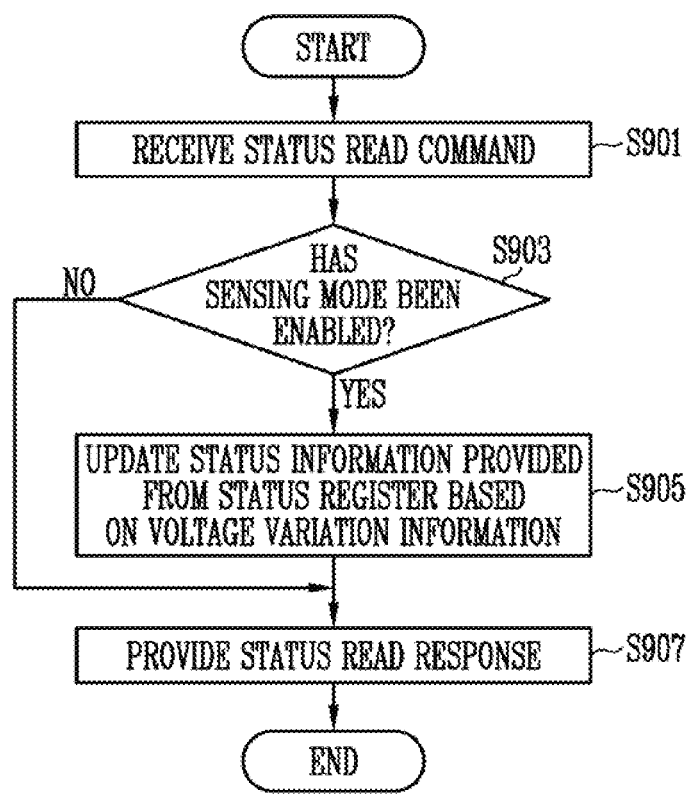
FIG. 9 is a flowchart illustrating the operation of a memory device according to an embodiment.

FIG. 9 is a flowchart illustrating the operation of a memory device according to an embodiment.

Referring to FIG. 9, at step S901, the memory device may receive a status read command from the memory controller. The status read command may be a command requesting a value stored in the status register.

At step S903, the memory device may determine whether a sensing mode has been enabled. For example, the memory device may determine, based on sensing mode setting information stored in a power register, whether the sensing mode has been enabled. When the sensing mode setting information indicates an ON state, the sensing mode may be in an enabled state, whereas when the sensing mode setting information indicates an OFF state, the sensing mode may be in a disabled state.

When the sensing mode is enabled, the process proceeds to step S905, whereas when the sensing mode is disabled, the process proceeds to step S907.

At step S905, the memory device may update status information provided from the status register based on voltage variation information stored in a power register.

In detail, the memory device may update pass/fail information included in the status information based on the voltage variation information. The memory device may set the status information so that, when it is determined, based on the voltage variation information, that voltage variation has occurred, pass/fail information indicates 'fail'.

At step S907, the memory device may provide a status read response including the status information to the memory controller.

Figure 10:
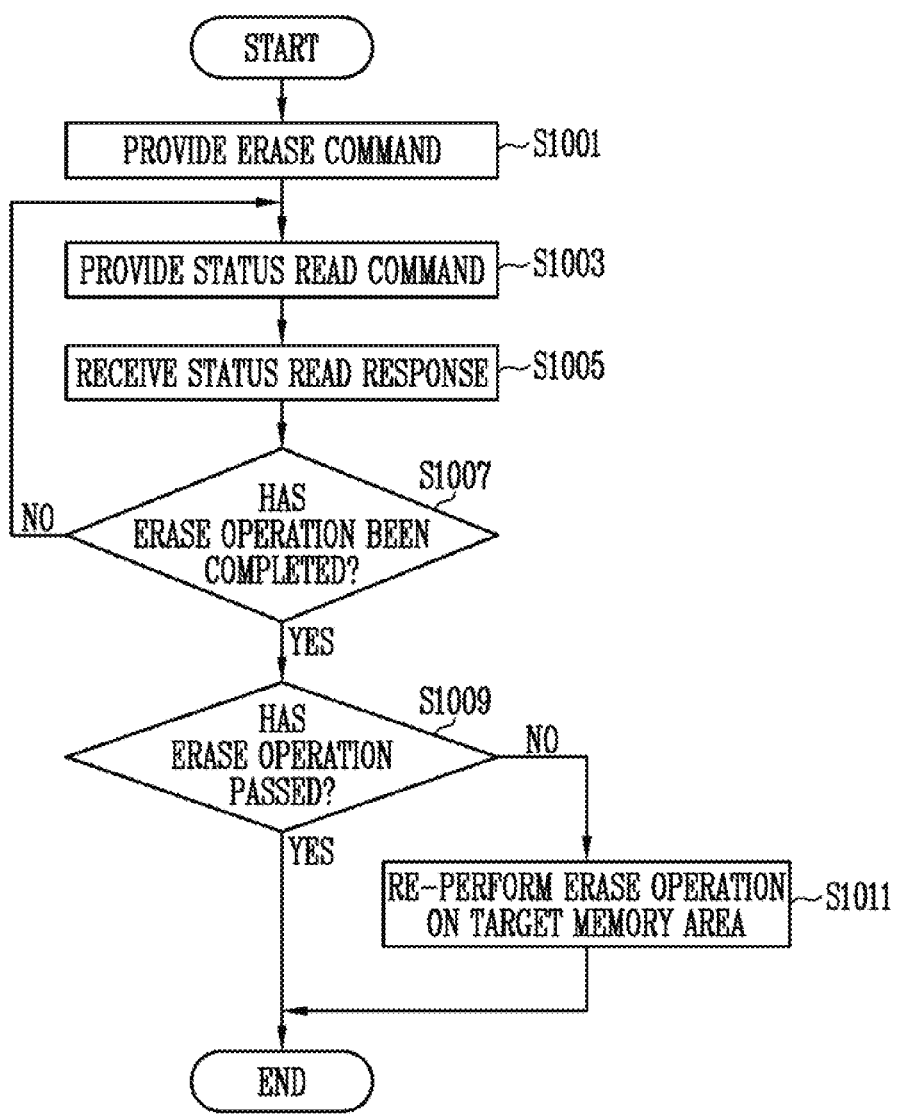
FIG. 10 is a flowchart illustrating the operation of a memory controller according to an embodiment.

FIG. 10 is a flowchart illustrating the operation of a memory controller according to an embodiment.

Referring to FIG. 10, at step S1001, the memory controller may provide an erase command to the memory device. When providing the erase command to the memory device, the memory controller may provide an address indicating a memory area (memory block) to be erased, together with an erase command.

At step S1003, the memory controller may provide a status read command to the memory device. In an embodiment, when a preset time has elapsed since the provision of the erase command described at step S1001, the memory controller may provide the status read command at step S1003 to the memory device. The status read command may be a command requesting the value of the status register which stores the status information indicating the operating status of the memory device.

At step S1005, the memory controller may receive a status read response corresponding to the status read command from the memory device. The status read response may include status information indicating the operating status of the memory device.

At step S1007, the memory controller may determine, based on the status information included in the status read response, whether the erase operation has been completed. The status information may include ready/busy information, pass/fail information, and normal operation information. The memory controller may determine, based on the ready/busy information, whether the erase operation has been completed. When the erase operation has been completed, the process proceeds to step S1009, whereas when the erase operation has not been completed, the process returns to step S1003.

At step S1009, the memory controller may determine, based on the pass/fail information included in the status information, whether the erase operation has passed. When the erase operation has passed, the process is terminated, whereas when the erase operation has failed, the process proceeds to step S1011.

At step S1011, the memory controller may control the memory device so that the erase operation is re-performed on an erase target memory area because the erase operation has not been normally completed.

Figure 11:
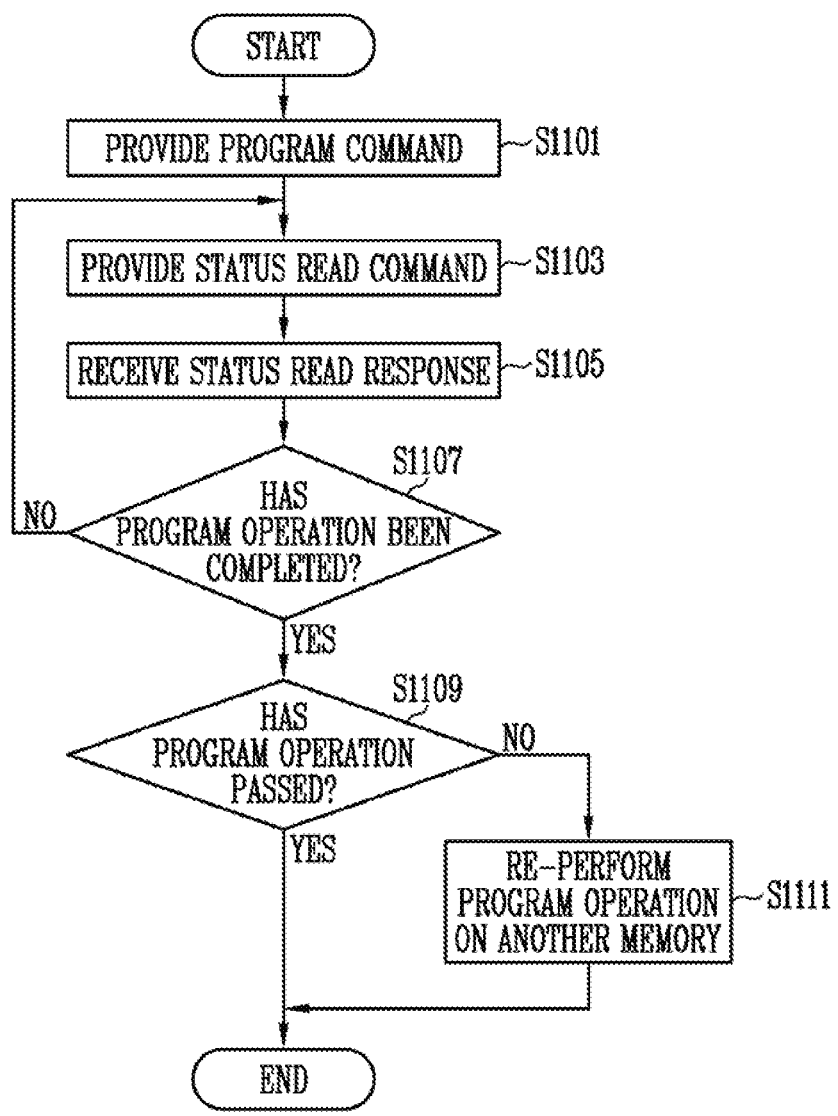
FIG. 11 is a flowchart illustrating the operation of a memory controller according to an embodiment.

FIG. 11 is a flowchart illustrating the operation of a memory controller according to an embodiment.

Referring to FIG. 11, at step S1101, the memory controller may provide a program command to the memory device. When providing the program command to the memory device, the memory controller may provide a program address, which indicates a memory area to which data is to be programmed, and program data, which indicates data to be programmed, together with the program command.

At step S1103, the memory controller may provide a status read command to the memory device. In an embodiment, when a preset time has elapsed since the provision of the program command described at step S1101, the memory controller may provide the status read command at step S1103 to the memory device. The status read command may be a command that requests the value of the status register which stores the status information indicating the operating status of the memory device.

At step S1105, the memory controller may receive a status read response corresponding to the status read command from the memory device. The status read response may include status information indicating the operating status of the memory device.

At step S1107, the memory controller may determine, based on the status information included in the status read response, whether the program operation has been completed. The status information may include ready/busy information, pass/fail information, and normal operation information. The memory controller may determine, based on the ready/busy information, whether the program operation has been completed. When the program operation has been completed, the process proceeds to step S1109, whereas when the program operation has not been completed, the process returns to step S1103.

At step S1109, the memory controller may determine, based on the pass/fail information included in the status information, whether the program operation has passed. When the program operation has passed, the process is terminated, whereas when the program operation has failed, the process proceeds to step S1111.

At step S1111, the memory controller may control the memory device so that the program operation is re-performed on another memory area because the program operation has not been normally completed.

Figure 12:
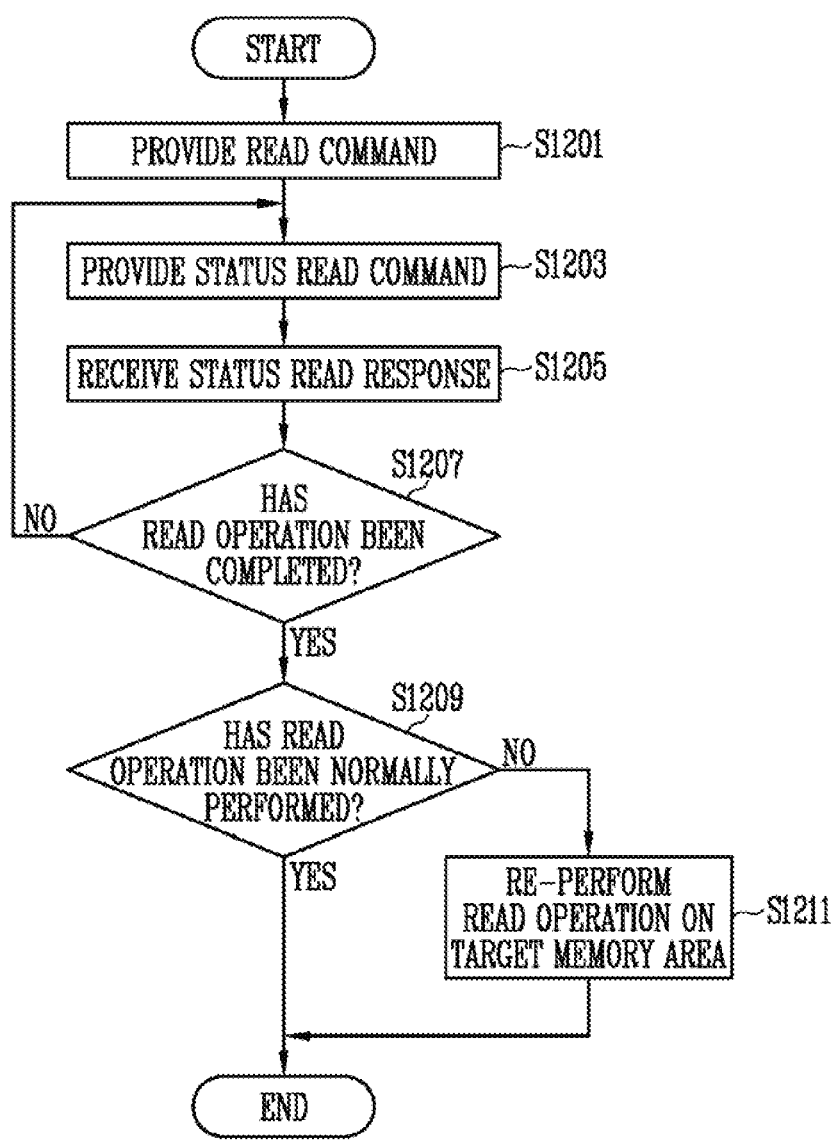
FIG. 12 is a flowchart illustrating the operation of a memory controller according to an embodiment.

FIG. 12 is a flowchart illustrating the operation of a memory controller according to an embodiment.

Referring to FIG. 12, at step S1201, the memory controller may provide a read command to the memory device. When providing the read command to the memory device, the memory controller may provide a read address indicating a memory area from which data is to be read, together with the read command.

At step S1203, the memory controller may provide a status read command to the memory device. In an embodiment, when a preset time has elapsed since the provision of the read command described at step S1201, the memory controller may provide the status read command at step S1203 to the memory device. The status read command may be a command requesting the value of the status register which stores the status information indicating the operating status of the memory device.

At step S1205, the memory controller may receive a status read response corresponding to the status read command from the memory device. The status read response may include status information indicating the operating status of the memory device.

At step S1207, the memory controller may determine, based on the status information included in the status read response, whether the read operation has been completed. The status information may include ready/busy information, pass/fail information, and normal operation information. The memory controller may determine, based on the ready/busy information, whether the read operation has been completed. When the read operation has been completed, the process proceeds to step S1209, whereas when the read operation has not been completed, the process returns to step S1203.

At step S1209, the memory controller may determine, based on the normal operation information included in the status information, whether the read operation has been normally performed. When the read operation has been normally performed, the process is terminated, whereas when the read operation has been abnormally performed, the process proceeds to step S1211.

In various embodiments, when the read operation has been normally performed, the memory controller may perform error correction decoding (not illustrated) on the read data acquired from the memory device depending on the read operation. As a result of performing error correction decoding, when the number of fail bits contained in the read data is less than or equal to the number of correctable bits, the read operation may indicate 'pass', whereas when the number of fail bits is greater than the number of correctable error bits, the read operation may indicate 'fail'. When the read operation fails, the memory controller may control the memory device so that the read operation is re-performed on a target memory area.

At step S1211, the memory controller may control the memory device so that the read operation is re-performed on the target memory area because the read operation has not been normally performed.

Figure 13:
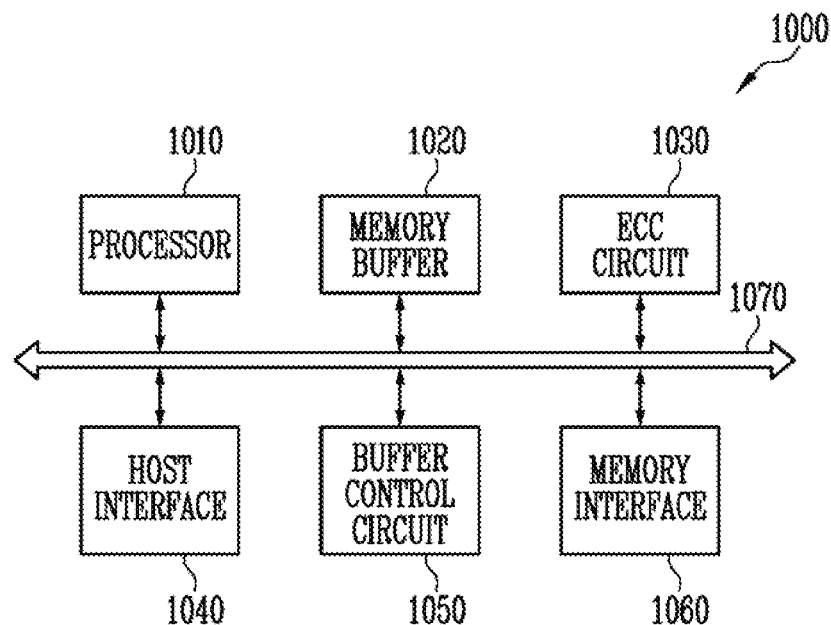
FIG. 13 is a diagram illustrating an embodiment of the memory controller of FIG. 1.

FIG. 13 is a diagram illustrating an embodiment of the memory controllers of FIG. 1.

Referring to FIG. 13, a memory controller 1000 is coupled to a host and a memory device. In response to a request received from the host, the memory controller 1000 may access the memory device. For example, the memory controller 1000 may be configured to control write, read, erase, and background operations of the memory device. The memory controller 1000 may provide an interface between the memory device and the host. The memory controller 1000 may run firmware for controlling the memory device.

The memory controller 1000 may include a processor 1010, a memory buffer 1020, an error correction circuit (Error Correction Code: ECC circuit) 1030, a host interface 1040, a buffer control circuit 1050, a memory interface 1060, and a bus 1070.

The bus 1070 may provide channels between components of the memory controller 1000.

The processor 1010 may control the overall operation of the memory controller 1000 and may perform a logical operation. The processor 1010 may communicate with an external host through the host interface 1040 and also communicate with the memory device through the memory interface 1060. Further, the processor 1010 may communicate with the memory buffer 1020 through the buffer control circuit 1050. The processor 1010 may control the operation of the storage device by using the memory buffer 1020 as a working memory, a cache memory or a buffer memory.

The processor 1010 may perform the function of a flash translation layer (FTL). The processor 1010 may translate a logical block address (LBA), provided by the host, into a physical block address (PBA) through the FTL. The FTL may receive the LBA using a mapping table and translate the LBA into the PBA. Examples of an address mapping method performed through the FTL may include various methods according to a mapping unit. Representative address mapping methods include a page mapping method, a block mapping method, and a hybrid mapping method.

The processor 1010 may randomize data received from the host. For example, the processor 1010 may use a randomizing seed to randomize data received from the host. The randomized data may be provided, as data to be stored, to the memory device and may be programmed in the memory cell array.

The processor 1010 may derandomize data received from the memory device during a read operation. For example, the processor 1010 may derandomize the data received from the memory device using a derandomizing seed. The derandomized data may be output to the host.

In an embodiment, the processor 1010 may run software or firmware to perform randomizing and derandomizing operations.

In an embodiment, the processor 1010 may include an operation controller 210 and a power controller 220 of FIG. 1.

The memory buffer 1020 may be used as a working memory, a cache memory, or a buffer memory of the processor 1010. The memory buffer 1020 may store codes and commands executed by the processor 1010. The memory buffer 1020 may store data that is processed by the processor 1010. The memory buffer 1020 may include a static RAM (SRAM) or a dynamic RAM (DRAM).

The ECC circuit 1030 may perform error correction. The ECC circuit 1030 may perform error correcting code (ECC) encoding based on data to be written to the memory device through the memory interface 1060. The ECC-encoded data may be transferred to the memory device through the memory interface 1060. The ECC circuit 1030 may perform ECC decoding based on data received from the memory device through the memory interface 1060. In an example, the ECC circuit 1030 may be included as the component of the memory interface 1060 in the memory interface 1060.

The host interface 1040 may communicate with the external host under the control of the processor 1010. The host interface 1040 may perform communication using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The buffer control circuit 1050 may control the memory buffer 1020 under the control of the processor 1010.

The memory interface 1060 may communicate with the memory device under the control of the processor 1010. The memory interface 1060 may transmit/receive commands, addresses, and data to/from the memory device through channels.

In an embodiment, the memory controller 1000 might not include the memory buffer 1020 and the buffer control circuit 1050.

In an embodiment, the processor 1010 may control the operation of the memory controller 1000 using codes. The processor 1010 may load codes from a nonvolatile memory device (e.g., ROM) provided in the memory controller 1000. In an embodiment, the processor 1010 may load codes from the memory device through the memory interface 1060.

In an embodiment, the bus 1070 of the memory controller 1000 may be divided into a control bus and a data bus. The data bus may be configured to transmit data in the memory controller 1000, and the control bus may be configured to transmit control information such as commands or addresses in the memory controller 1000. The data bus and the control bus may be isolated from each other, and may neither interfere with each other nor influence each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 14:
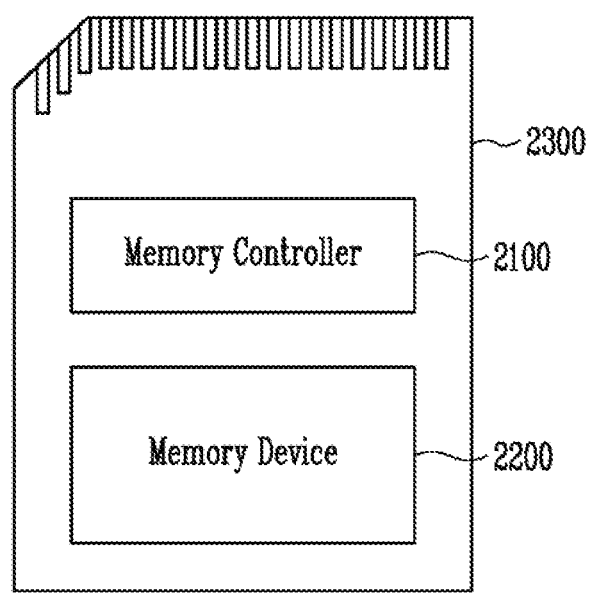
FIG. 14 is a block diagram illustrating a memory card system to which a storage device according to an embodiment of the present disclosure is applied.

FIG. 14 is a block diagram illustrating a memory card system to which the storage device according to an embodiment of the present disclosure is applied.

Referring to FIG. 14, a memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may be control read, write, erase, and background operations of the memory device 2200. The memory controller 2100 may provide an interface between the memory device 2200 and a host. The memory controller 2100 may run firmware for controlling the memory device 2200. The memory controller 2100 may be implemented in the same way as the memory controllers 200 described above with reference to FIG. 1.

In an embodiment, the memory controller 2100 may include components, such as a RAM, a processor, a host interface, a memory interface, and an ECC circuit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), a Spin-Torque Magnetic RAM (STT-MRAM).

The memory controller 2100 and the memory device 2200 may be integrated into a single semiconductor device to configure a memory card. For example, the memory controller 2100 and the memory device 2200 may be integrated into a single semiconductor device to configure a memory card such as a PC card (personal computer memory card international association: PCMCIA), a compact flash card (CF), a smart media card (SM or SMC), a memory stick, a multimedia card (MMC, RS-MMC, MMCmicro or eMMC), a SD card (SD, miniSD, microSD, or SDHC), or a universal flash storage (UFS).

Figure 15:
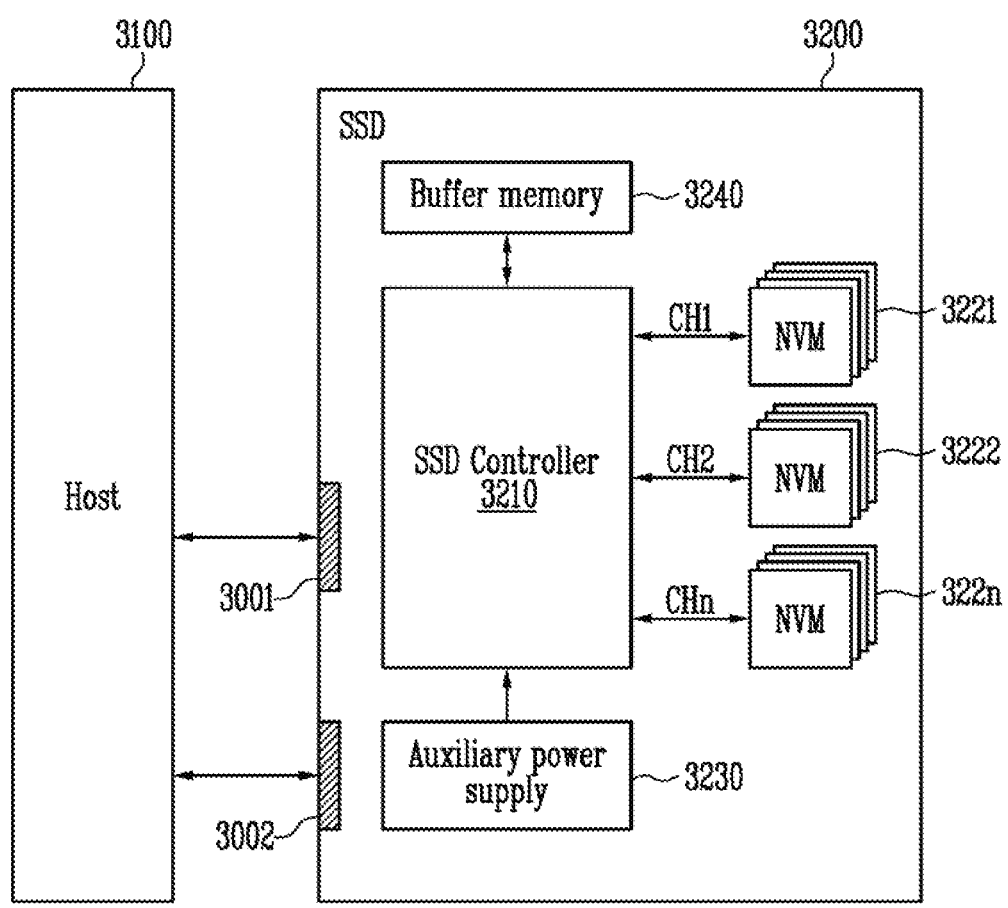
FIG. 15 is a block diagram illustrating an example of a solid state drive (SSD) system to which a storage device according to an embodiment of the present disclosure is applied.

FIG. 15 is a block diagram illustrating a solid state drive (SSD) system to which the storage device according to an embodiment of the present disclosure is applied.

Referring to FIG. 15, an SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In accordance with an embodiment of the present disclosure, the SSD controller 3210 may perform the function of the memory controllers 200 described above with reference to FIG. 1.

The SSD controller 3210 may control the plurality of flash memories 3221 to 322n in response to the signals SIG received from the host 3100. In an embodiment, the signals SIG may be signals based on the interfaces of the host 3100 and the SSD 3200. For example, the signals SIG may be signals defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100 and may be charged. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., mapping tables) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

FIG. 16 is a block diagram illustrating a user system to which the storage device according to an embodiment of the present disclosure is applied.

Referring to FIG. 16, a user system 4000 may include an application processor 4100, a memory module 4200, a network module 4300, a storage module 4400, and a user interface 4500.

The application processor 4100 may run components included in the user system 4000, an Operating System (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDRAM, LPDDR2 SDRAM, and LPDDR3 SDRAM, or nonvolatile RAMs such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), WiMAX, WLAN, UWB, Bluetooth, or Wi-Fi communication. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, each of which may be operated in the same way as the memory devices 100 described above with reference to FIG. 1. The storage module 4400 may be operated in the same way as the storage devices 50 described above with reference to FIG. 1.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a monitor.

In accordance with the present disclosure, there are provided a storage device that detects voltage variation and a method of operating the storage device.

What is claimed is:

1. A memory device, comprising:
a memory cell array including a plurality of memory cells;
a peripheral circuit configured to perform an operation on memory cells selected from among the plurality of memory cells;
a voltage variation detector configured to generate voltage variation information indicating whether a voltage variation has occurred in a supply voltage during performance of the operation;
a power register configured to store the voltage variation information;
a status register configured to store status information indicating an operating status of the memory device; and
a register output controller configured to update the status information provided from the status register based on the voltage variation information.

2. The memory device according to claim 1, wherein the voltage variation detector determines whether the voltage variation has occurred depending on whether the supply voltage exceeds a voltage threshold range.

3. The memory device according to claim 2, wherein the power register stores threshold voltage information including a first threshold voltage level and a second threshold voltage level for determining the voltage threshold range.

4. The memory device according to claim 3, wherein the voltage variation information includes voltage drop information indicating whether a voltage drop has occurred in the supply voltage and voltage rise information indicating whether a voltage rise has occurred in the supply voltage.

5. The memory device according to claim 4, wherein the voltage variation detector generates the voltage rise information when the supply voltage is higher than the first threshold voltage level.

6. The memory device according to claim 4, wherein the voltage variation detector generates the voltage drop information when the supply voltage is lower than the second threshold voltage level.

7. The memory device according to claim 1, wherein the status information includes at least one of pass and fail information indicating whether the operation has failed and normal operation information indicating whether the operation has been normally performed.

8. The memory device according to claim 7, wherein the register output controller updates the at least one of pass and fail information and the normal operation information based on the voltage variation information.

9. The memory device according to claim 1, wherein the register output controller provides a status read response including the updated status information to a memory controller in response to a status read command received from the memory controller.

10. The memory device according to claim 1, wherein the operation is one of a program operation, an erase operation, and a read operation.

11. A method of operating a memory device including a power register and a status register, the method comprising:
initiating an operation to be performed on memory cells selected from among a plurality of memory cells in response to a command received from a memory controller;
storing voltage variation information, indicating whether a voltage variation has occurred in a supply voltage during performance of the operation, in the power register;
storing status information indicating an operating status of the memory device in the status register; and
updating the status information provided from the status register based on the voltage variation information.

12. The method according to claim 11, further comprising:
receiving a status read command from the memory controller; and
providing a status read response including the updated status information to the memory controller in response to the status read command.

13. The method according to claim 11, wherein the status information includes at least one of pass and fail information indicating whether the operation has failed and normal operation information indicating whether the operation has been normally performed.

14. The method according to claim 13, wherein updating the status information is configured to update the at least one of pass and fail information and the normal operation information based on the voltage variation information.

15. A storage device, comprising:
- a memory device configured to store voltage variation information indicating whether a voltage variation has occurred in a supply voltage during performance of the operation, store status information indicating an operating status of the memory device, and generate updated status information in which the status information is updated based on the voltage variation information; and
- a memory controller configured to set a voltage threshold range for determining whether the voltage variation has occurred, determine based on the updated status information whether one of the operation has failed and has been abnormally performed, and control the memory device so that the operation is re-performed based on a result of the determination.

16. The storage device according to claim 15, wherein the memory device determines whether the voltage variation has occurred in the supply voltage depending on whether the supply voltage exceeds the voltage threshold range.

17. The storage device according to claim 15, wherein:
- the memory controller provides a set power command for setting the voltage threshold range to the memory device,
- the set power command includes at least one of a set feature command and a set parameter command.

18. The storage device according to claim 17, wherein the memory controller is configured to control the memory device so that, when the operation is a program operation and has failed, the program operation is re-performed on a memory area other than a memory area on which the program operation has been performed.

19. The storage device according to claim 17, wherein the memory controller is configured to control the memory device so that, when the operation is an erase operation and has failed, the erase operation is re-performed on a memory area on which the erase operation has been performed.

20. The storage device according to claim 17, wherein the memory controller is configured to control the memory device so that, when the operation is a read operation and has been abnormally performed, the read operation is re-performed on a memory area on which the read operation has been performed.

* * * * *